US007106237B1

(12) United States Patent
Confalonieri et al.

(10) Patent No.: US 7,106,237 B1
(45) Date of Patent: Sep. 12, 2006

(54) LOW CONSUMPTION AND LOW NOISE ANALOG-DIGITAL CONVERTER OF THE SAR TYPE AND METHOD OF EMPLOYING IT

(75) Inventors: Pierangelo Confalonieri, Caponago (IT); Marco Zamprogno, Cesano Maderno (IT); Francesca Girardi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/097,455

(22) Filed: Apr. 1, 2005

(30) Foreign Application Priority Data

Apr. 1, 2004 (EP) ................................. 04425241
Apr. 1, 2004 (EP) ................................. 04425242

(51) Int. Cl.
*H03M 1/12* (2006.01)
(52) U.S. Cl. ...................................... 341/155; 341/163
(58) Field of Classification Search ................ 341/155, 341/163, 172, 157
See application file for complete search history.

(56) References Cited

U.S. PATENT DOCUMENTS

| | | | | |
|---|---|---|---|---|
| 3,781,871 A | * | 12/1973 | Mattern | 341/136 |
| 4,388,612 A | | 6/1983 | Takagi et al. | 340/347 DA |
| 4,565,976 A | | 1/1986 | Campbell | 331/57 |
| 4,679,028 A | * | 7/1987 | Wilson et al. | 341/120 |
| 4,725,814 A | | 2/1988 | Pohl | 340/347 AD |
| 5,241,312 A | * | 8/1993 | Long | 341/163 |
| 5,260,705 A | | 11/1993 | Inukai | 341/155 |
| 5,422,807 A | | 6/1995 | Mitra et al. | 364/184 |
| 5,633,639 A | | 5/1997 | Hopkins | 341/161 |
| 5,757,302 A | | 5/1998 | Hino | 341/155 |
| 6,075,478 A | | 6/2000 | Abe | 341/155 |
| 6,154,163 A | * | 11/2000 | Rossi et al. | 341/161 |
| 6,329,938 B1 | | 12/2001 | Spaur et al. | 341/118 |
| 6,400,302 B1 | * | 6/2002 | Amazeen et al. | 341/172 |
| 6,556,164 B1 | | 4/2003 | Schmid | 341/163 |
| 6,873,272 B1 | * | 3/2005 | Pezzini | 341/120 |

FOREIGN PATENT DOCUMENTS

JP          56-44225          4/1981

* cited by examiner

*Primary Examiner*—Peguy JeanPierre
(74) *Attorney, Agent, or Firm*—Lisa K. Jorgenson; David V. Carlson; Seed IP Law Group PLLC

(57) ABSTRACT

The described converter comprises switched-capacitor quantization means for receiving an analog quantity to be converted, a register for a digital quantity corresponding to the analog quantity, a timing pulse generator and logic means capable of responding to a conversion request signal by activating the quantization means in such a way that they will carry out predetermined operations timed by the timing pulses and load in the register the digital quantity to be furnished as output. With a view to saving electric energy during the conversion and reducing the noise induced by the generator, the generator comprises means for modifying the duration and/or the frequency of the timing pulses in response to regulation signals emitted by the logic means. Also described is a method of using the converter that comprises the following phases: loading of the analog quantity in the quantization means, memorization of the loaded analog quantity and identification in the course of successive attempts in accordance with SAR technique of the bits of the digital code corresponding to the analog quantity to be converted. The duration and/or the frequency of the timing pulses are modified during at least one of the phases indicated above in response to regulation signals emitted by the logic means.

13 Claims, 8 Drawing Sheets

US 7,106,237 B1

LOW CONSUMPTION AND LOW NOISE ANALOG-DIGITAL CONVERTER OF THE SAR TYPE AND METHOD OF EMPLOYING IT

BACKGROUND OF THE INVENTION

1. Field of the Invention

The present invention relates to an analog-digital converter of the SAR type and a method of employing it.

2. Description of the Related Art

An analog-digital converter of the SAR (Successive Approximation Register) type is illustrated in a schematic manner by FIG. 1. It comprises elements for the quantization of an analog input parameter to be converted, in the form of a digital-analog converter DAC (which includes a reference voltage source VREF) and a comparator COMP, and a logic unit LOG (which includes a register REG) with timing and control functions connected to the converter DAC and the comparator COMP by means of a control bus CTRLBUS. A signal of timing or clock pulses (CLOCK) is applied to a terminal CK of the logic unit. An input voltage to be converted VIN is applied to the converter DAC and a conversion request signal CONVREQ is applied to a starting terminal STR of the logic unit LOG. A sequence of clock-pulse timed signals activates the converter DAC and the comparator COMP and makes possible the loading of the sample VIN to be converted. The register REG is set to a digital value corresponding to the centre of the scale of the conversion range (10000000 in the case of an 8-bit register). The converter DAC therefore furnishes an output voltage of VDAC=VREF/2. The comparator COMP compares this voltage with the voltage VIN and provides the result of the comparison to the logic unit. When VIN>VDAC, the comparator output is a logic "1" and the most significant bit of the register remains at "1". But when VIN<VDAC, the output of the comparator is a logic "0" and the most significant bit of the register is switched to a logic "0". The next bit of the register is then set to "1", followed by another comparison with the same criterion, and this is continued until the least significant bit has been examined. At this point the conversion is finished and the register contains the digital code, in this example consisting of 8 bits, corresponding to the input voltage VIN. This code is available at the output OUTBUS of the logic unit LOG and the register REG, which is the output of the converter.

A typical analog-digital converter of the SAR type uses a digital-analog converter DAC of the switched capacitor type, as shown in FIG. 2. For simplicity of representation, the figure shows a converter having a resolution of only 5 bits, but it is well known that converters with a much larger number of bits are used in actual practice, 12 being a case in point. The converter of FIG. 2 comprises an array 10 of six capacitors b1–b6 with each of which there is associated a two-way switch SW1–SW6. The capacitors b5 to b1 are weighted in binary code, i.e., they have capacitances that increase in accordance with a factor $2^i$, where i may vary between 0 and 4. The sixth capacitor, b6, has a capacitance equal to that of the capacitor b5 and serves to assure that the sum of the capacitances of the array will be exactly double the capacitance of the capacitor b1.

One electrode of each of the capacitors is connected to a common terminal NS. The two-way switches serve to connect the other electrode of each of the capacitors selectively to a first terminal, indicated by NC, or a second terminal, indicated by the ground symbol. The terminal NS may be connected to ground or may be left free by means of a one-way switch S2. By means of a two-way switch S1, the terminal NC may be selectively connected to an input terminal 11 to which there is applied the input signal VIN of the analog-digital converter or to a reference terminal 12 on which there is present the reference voltage VREF (provided by the voltage source included in the block DAC in the scheme of FIG. 1).

The terminal NS is connected to the non-inverting input terminal of an operational amplifier 13 that performs the function of the comparator COMP of FIG. 1. The inverting input terminal of the operational amplifier 13 is connected to ground. The output OutCmp of the comparator is connected to the logic unit LOG. The bus CTRLBUS issuing from the logic unit LOG carries control signals for the two-way switches SW1–SW6, the one-way switch S2 and the two-way switch S1 to operate them in accordance with a predetermined timing programme and as a function of the comparator output. It is to be understood that the two-way switches and the one-way switch are in practice constituted by controllable electronic connection devices, for example MOS transistors or combinations of MOS transistors. The logic unit LOG records the position of the switches SW1–SW5 in the register REG in order to furnish on the output OUTBUS a digital code corresponding to the analog input signal VIN.

Briefly described, the converter functions as follows:

in a first phase, the sampling phase, the switches are controlled by the logic unit LOG in such a manner as to be in the positions shown in FIG. 2, i.e., with the terminal NC connected by means of the switch S1 to the input terminal 11, to which there is applied the signal VIN to be converted, with the terminal NS connected by means of the switch S2 to ground and with all the lower electrodes of the capacitors connected by means of the switches SW1–SW6 associated with them to the terminal NC, so that all the capacitors are charged to the voltage VIN (referred to ground);

in the subsequent phase, the storage phase, the logic unit LOG causes the switch S2 to open and then causes the switches SW1–SW6 to switch and thus to connect the lower electrodes of all the capacitors to ground, with the result that the common terminal NS of the array 10 will assume the voltage −VIN (referred to ground);

at this point the logic unit LOG commences the operations typical of SAR technique to identify by means of successive attempts the values of the bits that make up the binary code that represents the sample of the analog input voltage; each "attempt" is carried out in one period of the clock signal; more particularly, during the high-level part of the clock signal, with a view to finding the most significant bit (first "attempt"), the lower electrode of the capacitor b1 of greater capacitance (C) is connected to the terminal 12, which is at the reference voltage VREF, by means of the switching of the switches SW1 and S1: this causes the voltage of the terminal NS to rise from −VIN to −VIN+VREF/2; the reference voltage VREF is chosen in such a way as to have a value equal to the maximum voltage VIN that can be converted;

during the low-level part of the clock signal the comparator COMP carries out a comparison: when the voltage −VIN+REF/2 is negative, the comparator COMP will have a low output signal and the logic unit LOG will maintain the switch SW1 in the position in which the lower electrode of the capacitor b1 is connected to the reference terminal 12 (VREF) and will transmit this position information to the register REG as corresponding to bit 1;

on the other hand, when the voltage −VIN+VREF/2 is positive, the comparator COMP will have a high output signal and the logic unit LOG will bring the switch SW1 back into the position in which the lower electrode of the capacitor b1 is connected to ground and will transmit this position information to the register REG as corresponding to a bit 0;

the same operation is carried out for the capacitor b2 in a subsequent period of the clock signal to find the second bit (second "attempt") and then repeated for all the remaining capacitors, excluding only the last, b6, which remains connected to ground for the entire duration of the SAR operations;

at the end the register REG will contain five bits that represent the final position of the switches SW1–SW5 and the binary code corresponding to the value of the sample input voltage VIN.

In the realization of a switched-capacitor converter of the type described above the source of the reference voltage VREF is in practice constituted by a buffer connected to a biasing circuit. This circuit is made in such a way as to generate a stable and precise reference voltage, substantially insensitive to temperature variations, supply voltage fluctuations of the integrated circuit and the variability of the manufacturing parameters. The buffer is typically constituted by an operational amplifier having a pass band sufficiently wide to satisfy the switching speed requirements of the converter and a capacity of supplying current such as to satisfy the power requirements of the converter.

Considering the functioning of a typical switched-capacitor converter in accordance with FIG. 2, one should note that the phase of charging the capacitors of the converter DAC in the subsequent operations (or "attempts") to determine the values of the bits to be sent to the output register is decisive for the purposes of dimensioning the reference voltage buffer. In particular, the buffer must be capable of charging the capacitors during one clock pulse, i.e., during the high part of the clock signal, which in the case of a typical clock signal with a duty cycle of 50% is half the period. The time available for charging the capacitors may be even shorter in actual practice if one bears in mind the fact that when one sets out to fabricate an integrated circuit containing a clock generator designed for a nominal duty cycle of 50%, one may obtain a real duty cycle comprised between 40% and 60% due to the effect of the variability of the manufacturing parameters. The designer must therefore take account of this uncertainty regarding the value of the duty cycle and dimension the buffer for the worst possible conditions.

A typical field of application of analog-digital converters of the type described above is that of cellular telephones. A strongly felt need when designing these telephones, as also many other types of battery-operated portable equipment, is to reduce the consumption of electric energy to a minimum. Analog-digital converters are among the devices that make a significant contribution to the consumption of the equipment. In particular, the contribution that the buffer makes to the overall consumption of the integrated circuit of which it forms part is always considerable and, in many cases, constitutes the greater part of the consumption of the converter.

BRIEF SUMMARY OF THE INVENTION

One object of the present invention is to propose an analog-digital converter of the SAR type and a method of employing such a converter that will make possible a low consumption of electric energy.

Another object is to propose an analog-digital converter of the SAR type and a method of employing such a converter that will make it possible to reduce, or eliminate the noise generated by the converter while it functions.

These and other objects are attained by realizing the converter of claim 1 and the method set out in claim 4.

BRIEF DESCRIPTION OF THE SEVERAL VIEWS OF THE DRAWINGS

The invention will be more clearly understood from the following detailed description of some of its embodiments, which are given by way of example and are not to be considered limitative in any way, the description making reference to the attached drawings, of which.

DETAILED DESCRIPTION OF THE INVENTION

Figure 1:
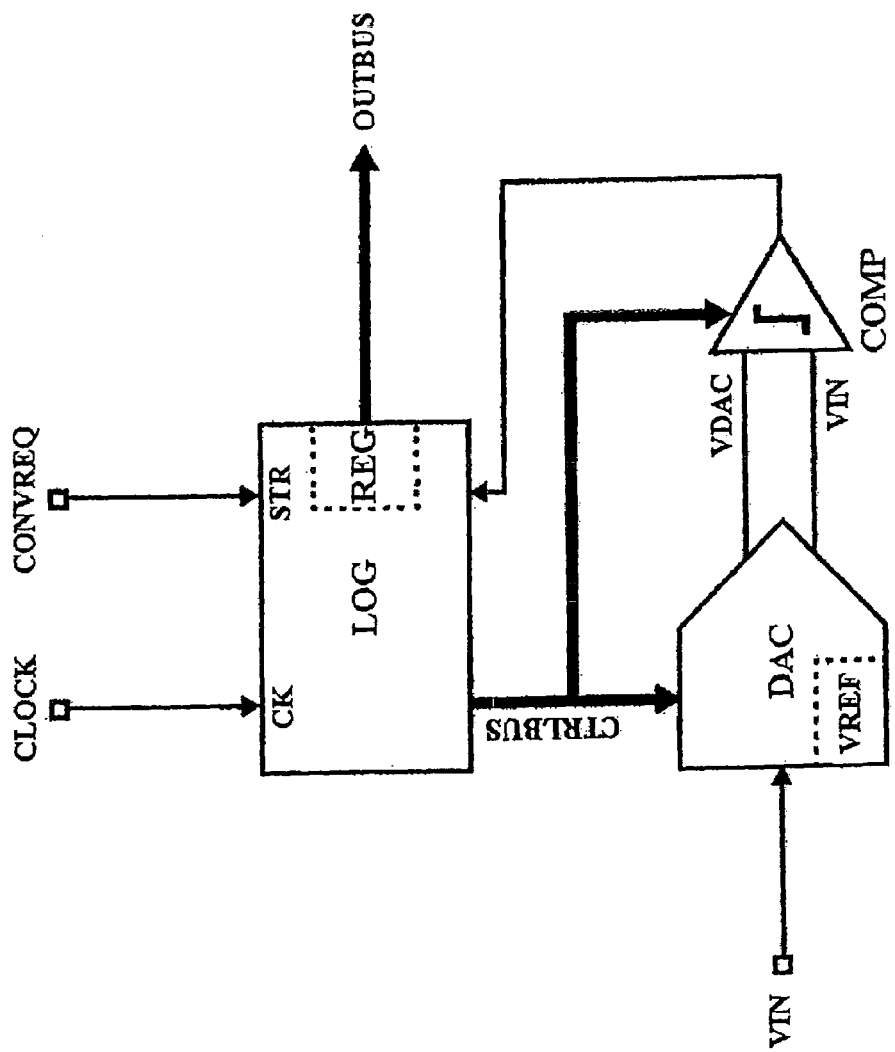
FIG. 1 schematically illustrates a known analog-digital converter of the SAR type.
Figure 3:
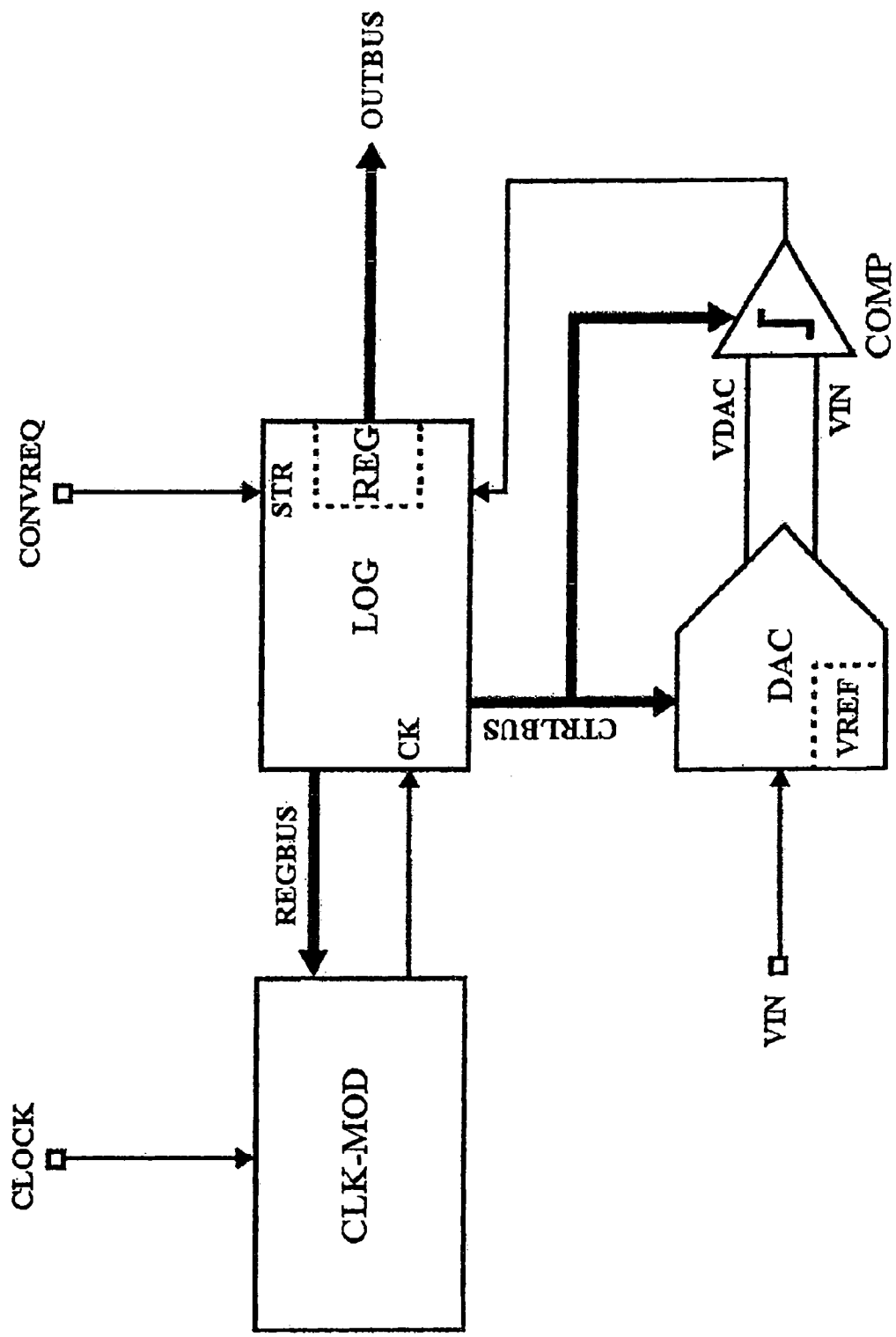
FIGS. 3 and 4 show the schematic layouts of two analog-digital converters of the SAR type in accordance with a first and a second embodiment of the invention, and FIGS. 5 to 8 each show some waveforms that illustrate different modes of functioning of the converter of FIG. 4.

The converter of FIG. 3 comprises the same functional blocks of DAC, COMP as the converter of FIG. 1. It differs from the FIG. 1 converter because the timing pulses that arrive at the terminal CK of the logic unit LOG come from a unit, indicated by CLK-MOD, that is capable of modifying the clock pulses arriving from the system clock, CLOCK in response to control signals provided by the logic unit LOG via a bus indicated by REGBUS. More particularly, these control signals modify the period and/or the duty cycle of the clock pulses in a discrete manner, in steps equal to half a clock period, and on the basis of criteria defined in the logic unit.

Figure 4:
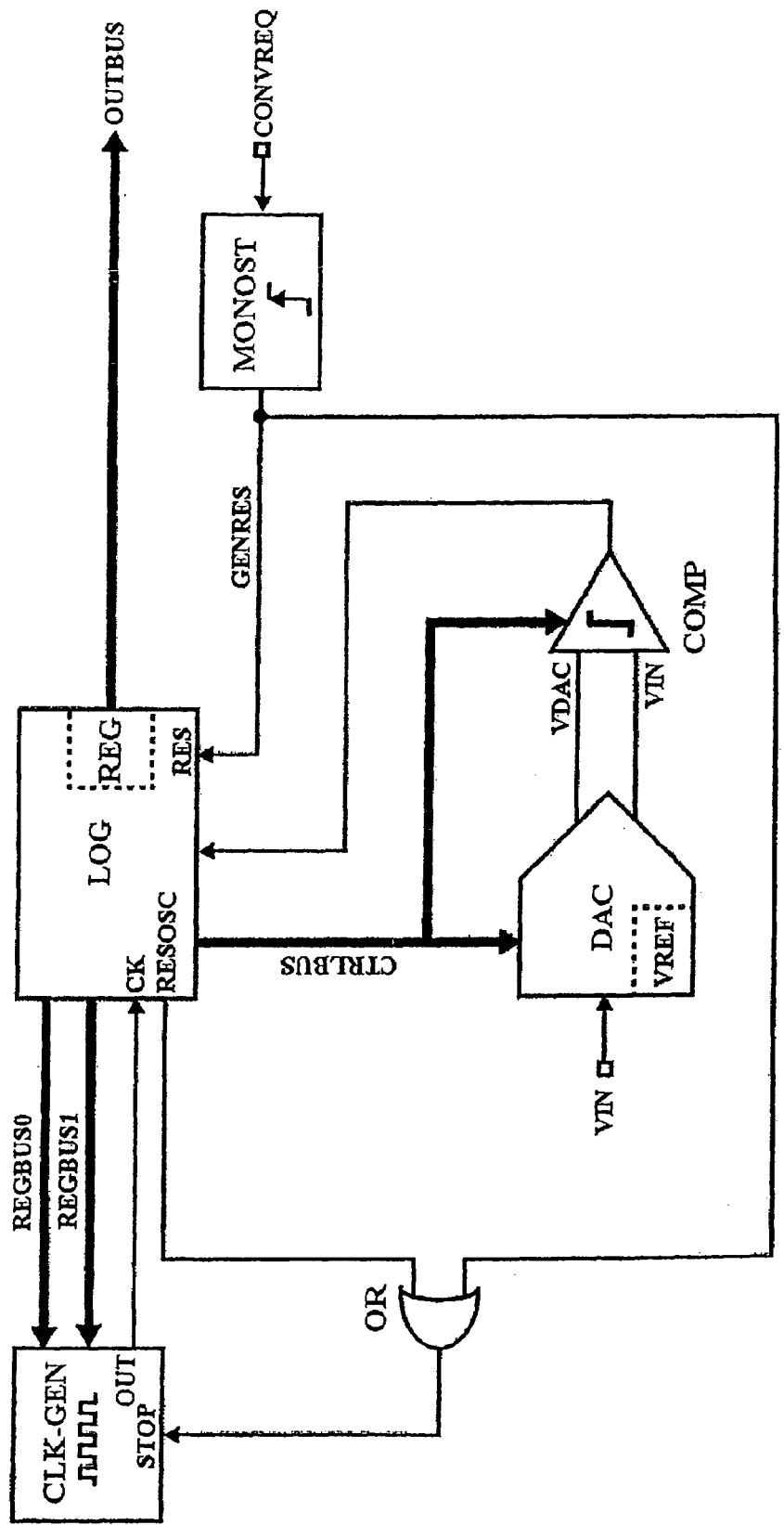

The converter of FIG. 4 comprises some functional blocks equal to those of the converter of FIG. 1, namely the blocks DAC and COMP. It differs in having a clock pulse generator CLK-GEN, a generator of single pulses, in this example a monostable analog circuit MONOST, and an OR logic gate. Further, the logic unit LOG is provided with an additional output RESOSC for a signal that will stop the generator CLK-GEN and two outputs, REGBUS0 and REGBUS1, for regulating the operating parameters of the generator. It should also be noted that the logic unit LOG has a starting terminal, here indicated by RES, that also performs a resetting function, as will be explained further on. A converter equal to the one of FIG. 4 is described in a patent application filed by the same applicants on the same day as the present application and entitled "Analog-digital converter", which claims priority from European Applications 04425241.9 filed Apr. 4, 2004 and 04425242.7 filed Apr. 1, 2004.

As shown in FIG. 4, the generator CLK-GEN has an output terminal OUT connected to the clock terminal CK of the logic unit LOG, an input activation terminal STOP connected to the output of the OR gate and two inputs connected to the logic unit by means of the two buses REGBUS0 and REGBUS1. The monostable circuit has an input terminal to which there is applied the conversion request signal CONVREQ and an output terminal GENRES connected to the starting and resetting input terminal RES of the logic unit and to an input terminal of the OR gate. The latter has a second input terminal connected to the output terminal RESOSC of the logic unit.

The generator CLK-GEN and the quantization elements DAC and COMP are incorporated in one and the same integrated circuit. Preferably, the other circuit blocks of FIG. 4 will also form part of the same integrated circuit.

The generator CLK-GEN is a pulse generator that becomes active when a binary signal applied to its input STOP finds itself in a predetermined state of its two logic states and on its output terminal OUT produces an oscillation that can immediately be used because it is not affected by transitory phenomena. Furthermore, when the signal at its input terminal STOP switches to the other of the two logic states, it stops in a known condition, i.e., all its nodes always have the same predetermined binary values; therefore, when it is restarted (STOP=0), it does so with an oscillation of the correct value right from the first half-period. A generator of this type is described in European Patent Application No. 04425100.7 filed by applicants on 18 Feb. 2004 under the title "Clock-pulse generator circuit".

Figure 5:
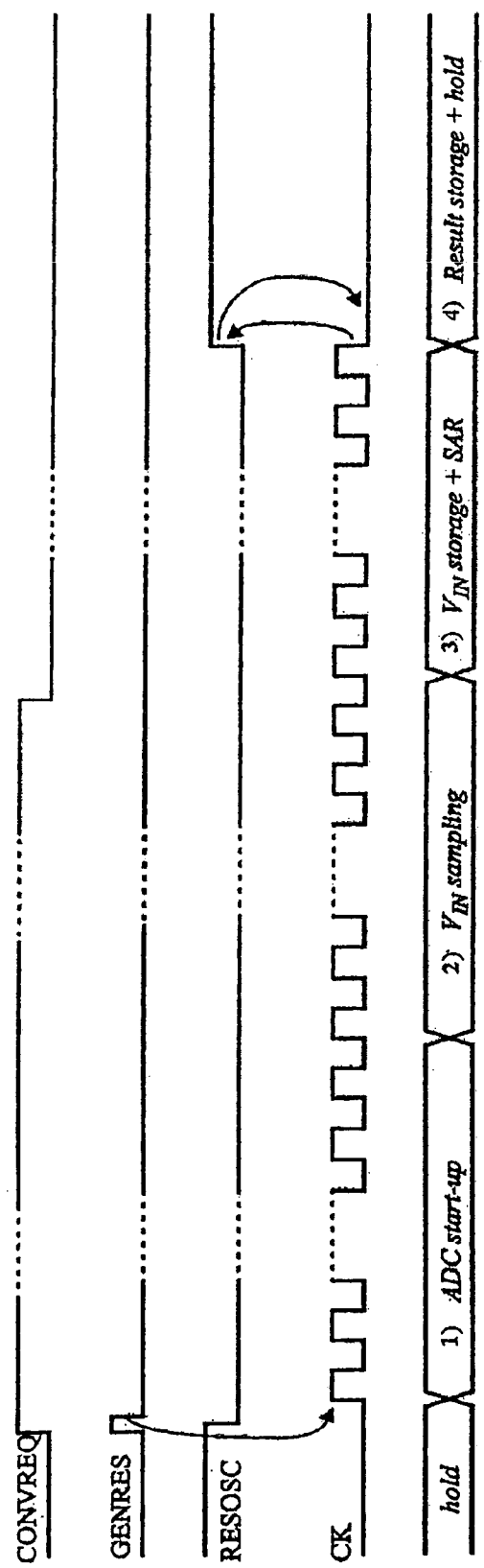

Let us now consider the functioning of the converter of FIG. 4 with reference to the waveforms shown in FIG. 5.

Figure 2:
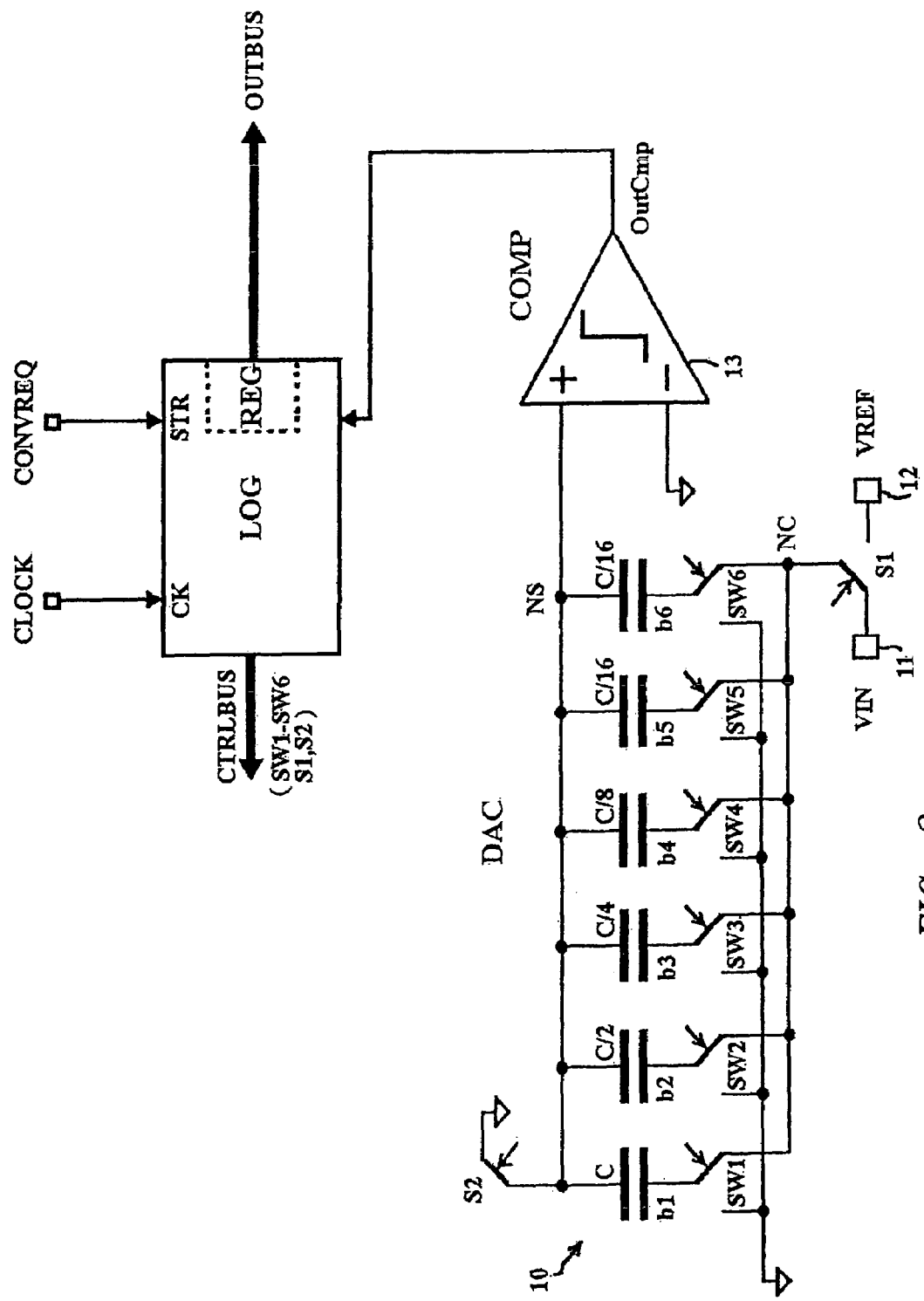
FIG. 2 shows a known analog-digital converter of the SAR type with switched capacitors.

Following a conversion request, the monostable circuit generates a pulse GENRES of a predetermined duration. In this example the pulse GENRES is produced when the signal CONVREQ applied as input to the monostable circuit switches from 0 to 1 and has a duration sufficient to set the logic unit LOG in its initial condition. In practice the signal GENRES brings a counter contained in the logic unit back to 0, sets the output RESOSC to 0 (for example, by means of a flip-flop which is controlled by the signal GENRES and maintains the set state also after the end of the signal GENRES) and prevents the activation of the oscillator for the whole of its duration. Indeed, it should be noted that the generator will not oscillate until STOP=1, i.e., both with RESOSC=1 and GENRES=1, while it will oscillate when STOP=0, i.e., only when the two inputs of the OR gate (RESOSC and GENRES) are both at 0. Be it noted also that in this way the start-up of the oscillator is delayed by a time equal to the duration of the pulse GENRES. When the pulse of the monostable circuit terminates (GENRES=0), the generator produces a clock signal CK that has a frequency and a duty cycle determined by the digital signals present on the buses REGBUS0 and REGBUS1, until such time as RESOSC returns to 1 and brings the generator to a halt (STOP=1). During the activity of the generator the clock signal increases the contents of the counter of the logic unit LOG, giving rise to the successive emission of the signals needed to cause the quantization elements (DAC, COMP) to perform the operations, timed by the timing pulses, for the conversion of the analog input sample VIN into a digital code. Starting from an initial condition of deactivation (hold) of all the circuits, during which the consumption of the device is only such as is due to the leakage currents, the conversion is performed in accordance with the following phases:

1) ACDstart-up: activation of the analog parts of the converter (DAC, reference voltage source, comparator COMP, possible biasing circuits);

2) VINsampling: the voltage signal VIN to be converted is loaded in the capacitors of the converter DAC (capacitor array 10 of FIG. 2);

3) VINstorage+SAR: the voltage VIN is memorized and the SAR procedure for the determination of the digital code corresponding to VIN is commenced;

4) Resultstorage+hold: the result is conveyed onto the output bus OUTBUS, the pulse generator is stopped and the analog parts are deactivated following an appropriate command of the logic unit.

At the beginning of Phase 4) the last trailing edge of the clock signal assures that the counter of the logic unit LOG will cause the signal RESOSC to switch to 1 (and also assure the transfer of the digital code resulting from the conversion to the bus OUTBUS and the deactivation of the circuits). The generator will therefore have STOP=1 at the activation input, so that the output OUT remains at 0 and the clock signal stops after the pulse that brought about the condition RESOSC=1: from this it follows that the logic unit LOG will cease all activity on account of the lack of a clock signal. This state is maintained until a new leading edge of the conversion request signal CONVREQ. The number of clock pulses for each phase depends on the circuit characteristics and parameters.

In the example described in relation to FIGS. 4 and 5 we considered a clock signal with a duty cycle of 50%. Nevertheless, this duty-cycle value, as also the frequency of the clock signal, may be changed arbitrarily, even while the generator is functioning, by appropriately changing the digital codes that the logic unit sends to the clock pulse generator on the buses bars REGBUS0 and REGBUS1.

Similarly, in the example illustrated by FIG. 3 the duty cycle and the period may be modified (discretely, in steps equal to half a period) by means of the digital signals sent by the logic unit LOG to the clock signal modification unit CLK-MOD via the bus REGBUS.

Figure 6:
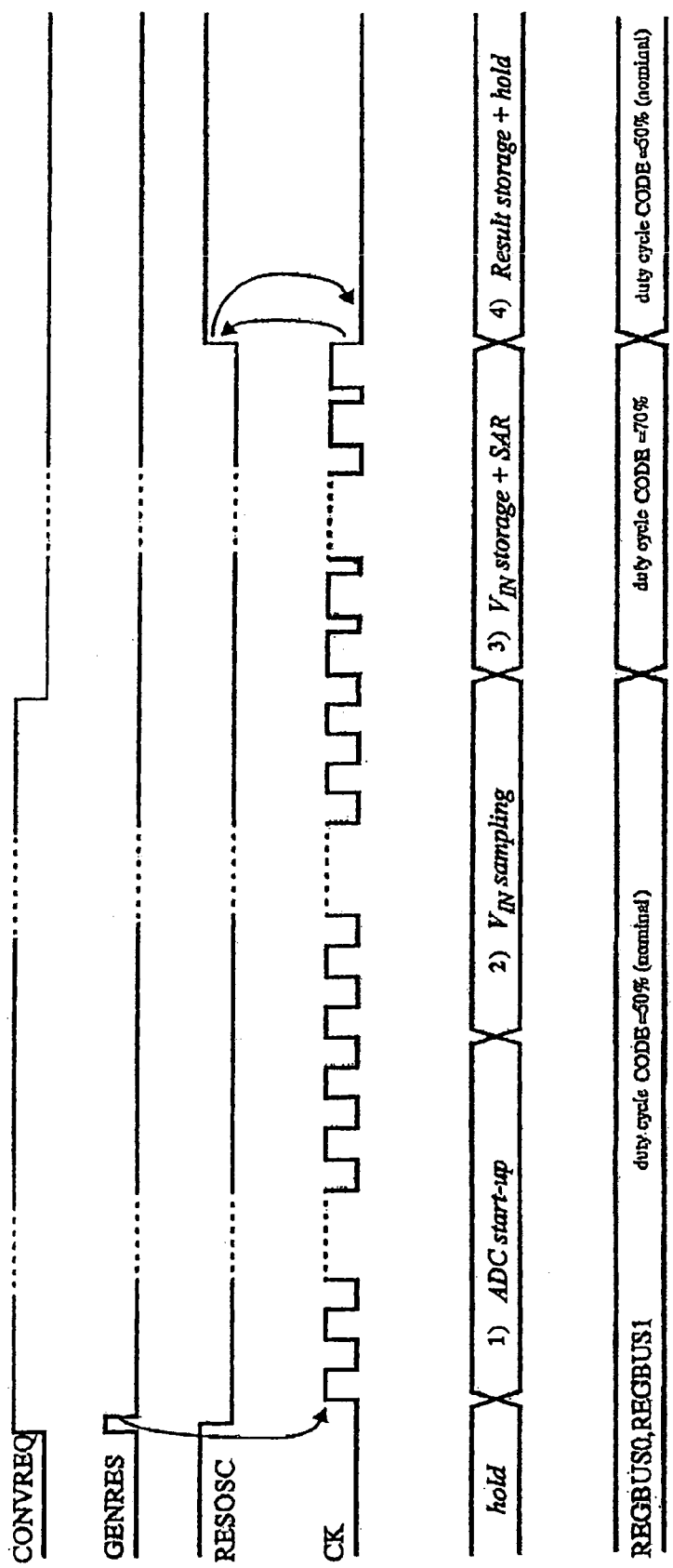

The possibility of modifying the timing pulses, together with the fact that the time needed for the comparison operation performed by the comparator COMP is much shorter than half a period of the clock signal, provides considerable advantages in terms of energy saving. In fact, the logic unit LOG may be programmed for regulating the duty cycle of the timing pulses in such a way that more time will be accorded to the charging operations than to the comparison operations. For example, as shown in FIG. 6, while the clock signal in Phases 1) and 2) has a duty cycle of 50%, in Phase 3) it has a duty cycle of 70% even though it maintains the same period. This behaviour is obtained by supplying to the generator CLK-GEN, via the bus bars REGBUS0 and REGBUS 1, digital codes that determine a duty cycle of 50% in Phases 1), 2) and 4), and digital codes that determine a duty cycle of 70% in Phase 4) and, more precisely, digital codes that determine a clock signal that will maintain its high value for a longer time for the charging phases and its low value for a shorter period of time for the comparison phases. Thanks to this possibility of modifying the duty cycle, the buffer of the reference voltage supply may be designed with an output capability less than those of currently known and used converters, with the advantage of a smaller energy consumption in operation.

Figure 7:
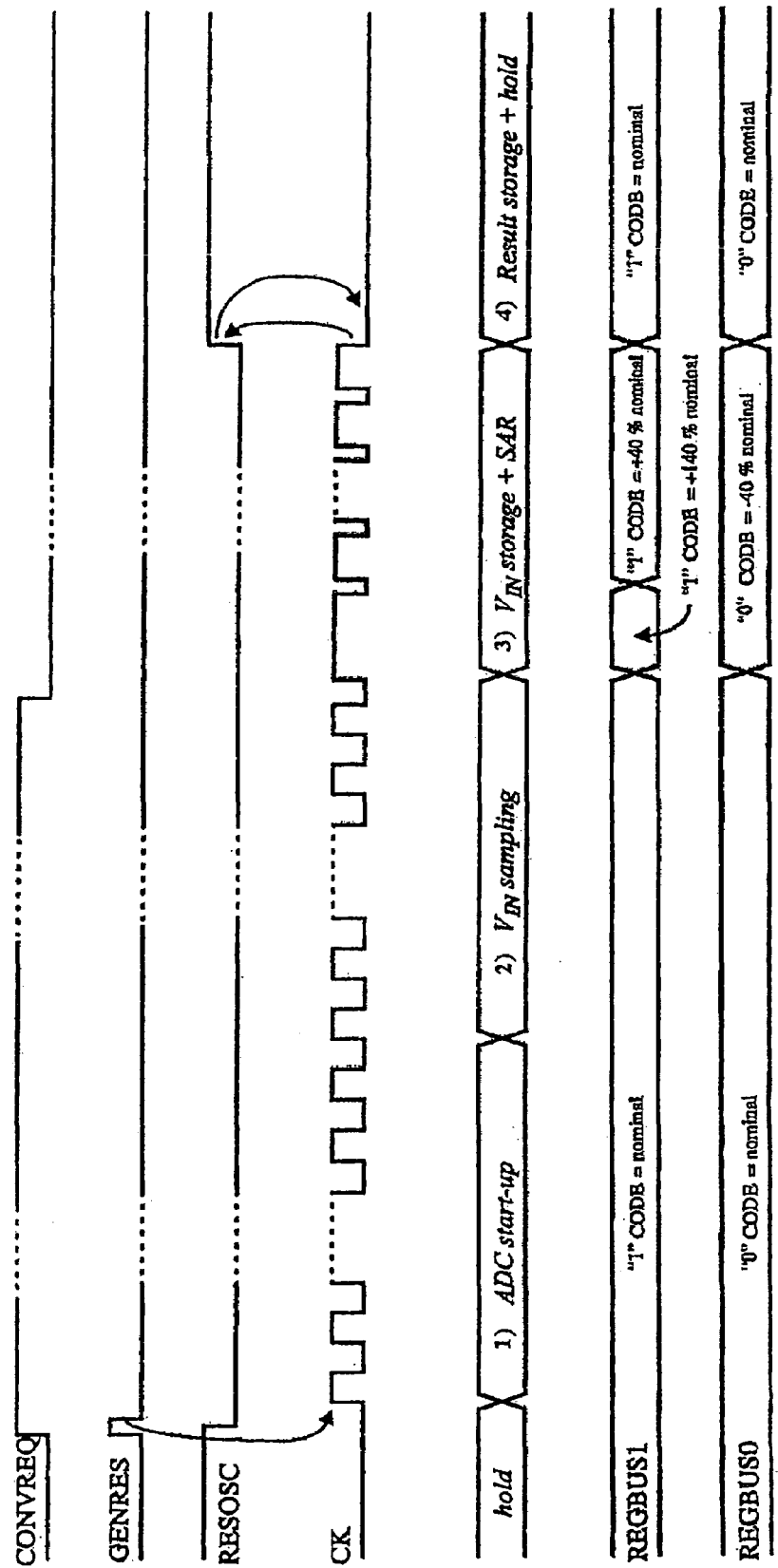

A further reduction of the consumption may be obtained by a further regulation of the duration of the clock signal during Phase 3). It should be noted that the consumption connected with the charging of the capacitors to the reference voltage VREF is directly proportional to the capacitances that have to be charged and inversely proportional to the time available for charging. Now, the maximum charging capacitance is associated with the first "attempt", i.e., with the charging of the capacitors for determining the most significant bit. The capacitances to be charged will thereafter reduce, halving on the occasion of each subsequent "attempt". If the clock signal is correspondingly modified to take account of this, one obtains a further significant reduction of the consumption of the buffer of the voltage VREF. FIG. 7 shows the case in which the digital code applied to REGBUS1 is such as to prolong the duration of the high value of the clock signal up to 140% for the first "attempt", while maintaining the duty cycle at 70% for the remaining "attempts". If this were desirable, it would also be possible to diversify the durations for the subsequent "attempts", even though the advantages in terms of energy saving reduce very rapidly as the order number of the "attempts" increases.

Figure 8:
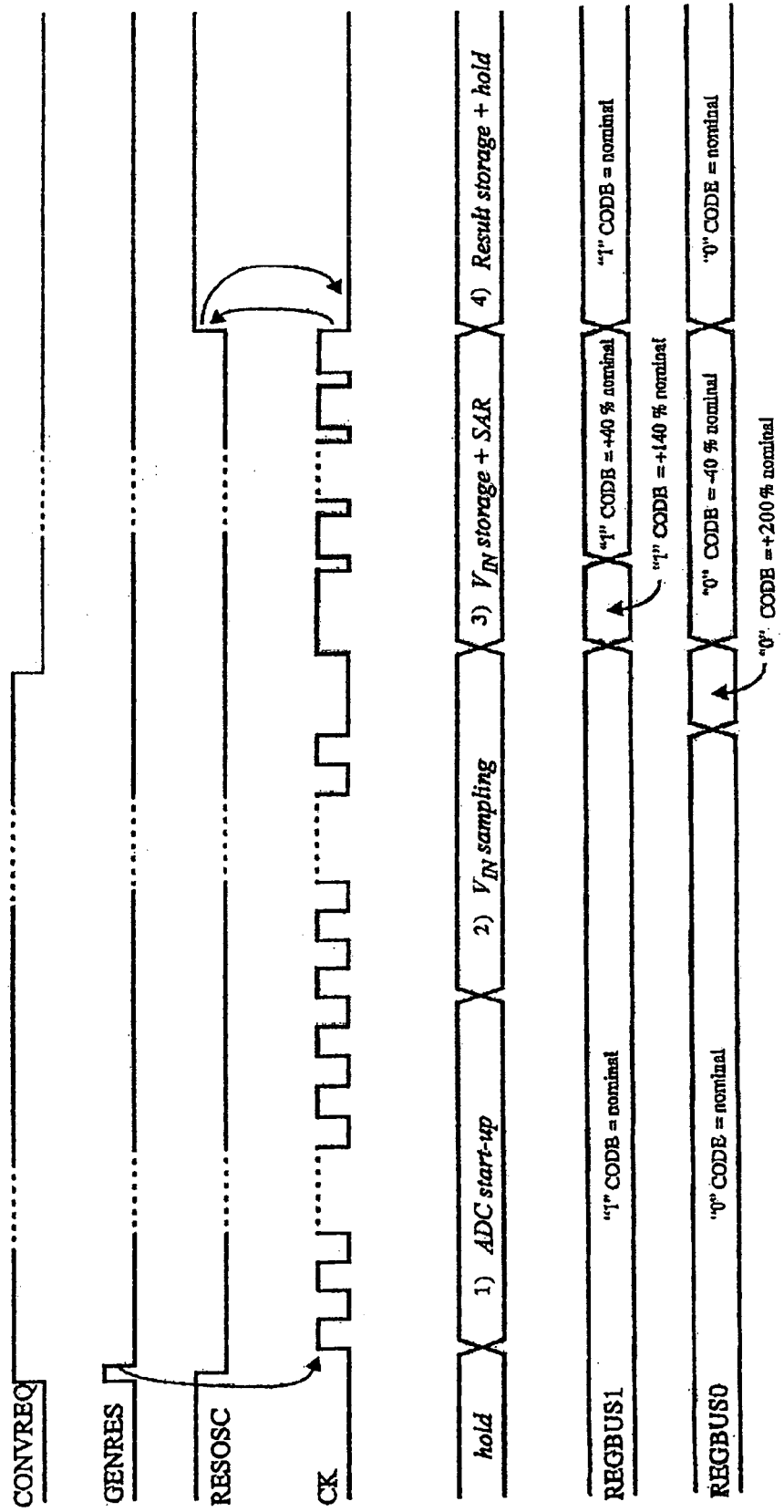

The converter and the method in accordance with the invention make it possible to eliminate or, at least, drastically reduce the noise and the offset that can be induced by parasite phenomena when relatively large currents are switched in the generator. The parasite phenomena are due to the inductances, resistances and capacitances associated with the connections between the integrated circuit and the terminals that connect it to the external circuits and can cause a damped oscillation on the supply voltages. A very critical phase of the functioning of the converter is the one in which the converter voltage VIN is memorized. If the edge of the clock pulse preceding the one used for the memorization generates an oscillation that has not yet been damped when the memorization edge arrives, the voltage VIN with respect to ground becomes altered, so that the memorized voltage is different from the one it is desired to convert. This problem is the more serious the higher the clock frequency is. To avoid this happening, the half-period of the clock signal that precedes the memorization edge—as shown in FIG. 8—is lengthened, tripled for example. To this end the code applied to the bus REGBUS0, which determines the duration of the time during which the clock signal maintains its low value, is appropriately modified before the memorization edge, so that the memorization edge will arrive when the oscillation has been practically completely damped.

As clearly brought out by what has been said above, the objects of the invention are fully attained, because with the described converter and method the electric energy necessary for performing the conversion can be determined without waste on the basis of the effective needs of each phase of the conversion and the noise normally associated with the switching of large currents in the clock generator can be practically eliminated.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An analog-digital converter of the SAR type, comprising:
    switched-capacitor quantization means having an input for receiving an analog quantity to be converted;
    a register having an output for providing a digital quantity corresponding to the analog quantity;
    a timing pulse generator configured to generate timing pulses; and
    a logic unit connected to the quantization means, the register, and the timing pulse generator, and adapted to respond to a conversion request signal by activating the quantization means so that the logic unit will carry out predetermined operations timed by the timing pulses and load in the register the digital quantity to be furnished as output, the logic unit identifying, through successive attempts, bit values of the digital quantity corresponding to the analog quantity, the logic unit producing regulation signals that are received by the timing pulse generator, the timing pulse generator having a regulation circuit capable of modifying the timing pulses in response to the regulation signals produced by the logic unit to increase a duration of a half-period of the timing pulses that precede identifying the bit values.

2. The converter according to claim 1 wherein the regulation circuit of the timing generator modifies a frequency of a duty cycle of the timing pulses.

3. The converter according to claim 1 wherein the regulation circuit of the timing generator modifies a duty cycle of the timing pulses.

4. A method for converting an analog quantity into a digital code by an analog-digital converter of the SAR type having predetermined operations timed by timing pulses, comprising the steps of:
    loading the analog quantity to be converted in a quantization unit;
    storing of the loaded analog quantity in memory;
    identifying in the course of successive attempts, by means of operations of charging capacitors and comparison in accordance with SAR technique, bit values of the digital code corresponding to the analog quantity to be converted, and;
    modifying a property of the timing pulses during at least one of the steps indicated above in response to regulation signals emitted by a logic unit that outputs the converted digital code, including increasing a half-period of the timing pulses that precede identifying bit values of the previous step.

5. The method in accordance with claim 4 wherein the property modified is a duty cycle of the timing pulses, the modification of the duty cycle taking place during the step of identifying by successive attempts, the modification of the duty cycle of the timing pulses prolonging the operations of charging the capacitors and shortening respective comparison operations.

6. The method in accordance with claim 5 wherein a frequency of the timing pulses is maintained unaltered.

7. The method in accordance with claim 4, wherein the property modified is a frequency of the timing pulses.

8. The method in accordance with claim 4 wherein a duration of the timing pulse in the operation of charging the capacitors for a first attempt is greater than the duration of the timing pulses for subsequent attempts.

9. A circuit, comprising:
    a switched-capacitor quantizer circuit having an input for receiving an analog quantity;
    a register having an output on which is generated a digital quantity corresponding to the analog quantity;
    a circuit for generating timing pulses; and
    a logic circuit coupled to the switched-capacitor quantizer circuit, the register, and the timing pulse generating circuit, the logic circuit adapted to carry out predetermined operations timed by the timing pulses in response to a conversion request signal and to load in the register the digital quantity, the logic unit identifying, through successive attempts, bit values of the digital quantity corresponding to the analog quantity, the logic circuit producing regulation signals to the circuit for generating timing pulses that are received by a regulation circuit in the circuit for generating timing pulses, the regulation circuit modifying the timing pulses in response to the regulation signals produced by the logic circuit to increase at least the duration of a half-period of timing pulses that precede the logic circuit identifying the bit values.

10. The circuit of claim 9 wherein the regulation circuit of the circuit for generating timing pulses modifies a frequency of a duty cycle of the timing pulses.

11. The circuit of claim 9 wherein the regulation circuit of the circuit for generating timing pulses modifies a duty cycle of the timing pulses.

12. The circuit of claim 9 wherein the logic circuit is configured to identify the bit values by means of operations of charging capacitors and comparison in accordance with SAR techniques.

13. The circuit of claim 12, wherein a duration of the timing pulses in the operation of charging the capacitors for a first identification attempt is greater than a duration of the timing pulses for subsequent identification attempts.

* * * * *